(12) United States Patent
Nishii

(10) Patent No.: US 11,164,950 B2
(45) Date of Patent: Nov. 2, 2021

(54) SEMICONDUCTOR DEVICE AND PRODUCTION METHOD

(71) Applicant: TOYODA GOSEI CO., LTD., Kiyosu (JP)

(72) Inventor: Junya Nishii, Kiyosu (JP)

(73) Assignee: TOYODA GOSEI CO., LTD., Kiyosu (JP)

(*) Notice: Subject to any disclaimer, the term of this patent is extended or adjusted under 35 U.S.C. 154(b) by 0 days.

(21) Appl. No.: 16/795,305

(22) Filed: Feb. 19, 2020

(65) Prior Publication Data

US 2020/0287008 A1 Sep. 10, 2020

(30) Foreign Application Priority Data

Mar. 7, 2019 (JP) .............................. JP2019-042083
Mar. 12, 2019 (JP) .............................. JP2019-045118

(51) Int. Cl.
| | |
|---|---|
| *H01L 29/423* | (2006.01) |
| *H01L 29/66* | (2006.01) |
| *H01L 29/808* | (2006.01) |
| *H01L 29/20* | (2006.01) |
| *H01L 29/78* | (2006.01) |
| *H01L 27/105* | (2006.01) |

(52) U.S. Cl.
CPC ........ *H01L 29/4236* (2013.01); *H01L 27/105* (2013.01); *H01L 29/2003* (2013.01); *H01L 29/66666* (2013.01); *H01L 29/7827* (2013.01); *H01L 29/8083* (2013.01)

(58) Field of Classification Search
None
See application file for complete search history.

(56) References Cited

U.S. PATENT DOCUMENTS

| | | | |
|---|---|---|---|
| 2013/0221434 A1* | 8/2013 | Okada | ................. H01L 29/7788 257/330 |
| 2015/0243516 A1 | 8/2015 | Ina et al. | |

(Continued)

FOREIGN PATENT DOCUMENTS

| | | | |
|---|---|---|---|
| JP | 2008226914 | * | 9/2008 |
| JP | 2009-117820 A | | 5/2009 |

(Continued)

*Primary Examiner* — Grant S Withers
(74) *Attorney, Agent, or Firm* — McGinn IP Law Group, PLLC

(57) ABSTRACT

The present invention provides a Group III nitride semiconductor device in which current concentration at the corners of the trench is suppressed. The semiconductor device has a pattern in which regular hexagonal unit cells are arranged in a honeycomb pattern. The semiconductor layer is sectionalized into regular hexagonal patterns by the trench. The recess has a small regular hexagonal pattern contained in the regular hexagonal pattern of the semiconductor layer sectionalized by the trench, which is obtained by reducing the regular hexagon of the semiconductor layer with the same center. Moreover, the regular hexagonal pattern of the recess is rotated by 30° with respect to the regular hexagon of the semiconductor layer. The Mg activation ratio is lower in the vicinity of corners of the trench than that in other regions in the vicinity of side walls of the trench of the p-type layer.

11 Claims, 6 Drawing Sheets

(56) References Cited

U.S. PATENT DOCUMENTS

| | | | | |
|---|---|---|---|---|
| 2016/0064502 | A1* | 3/2016 | Oka | H01L 29/66462 |
| | | | | 257/411 |
| 2017/0263725 | A1* | 9/2017 | Tanaka | H01L 29/7813 |
| 2020/0287012 | A1* | 9/2020 | Murakami | H01L 29/66734 |
| 2020/0328279 | A1* | 10/2020 | Hikosaka | H01L 29/66462 |
| 2020/0365725 | A1* | 11/2020 | Ueno | H01L 29/0878 |

FOREIGN PATENT DOCUMENTS

| | | | |
|---|---|---|---|
| JP | 2010062381 | * | 3/2010 |
| JP | 2015-159138 A | | 9/2015 |
| JP | 2015-125441 A | | 8/2018 |

* cited by examiner

SEMICONDUCTOR DEVICE AND PRODUCTION METHOD

BACKGROUND OF THE INVENTION

Field of the Invention

The present invention relates to a Group III nitride semiconductor device, and a production method therefor.

Background Art

Patent Document 1 discloses that in a Group III nitride semiconductor trench gate type FET, a p-type region with a Mg concentration lower than that of the p-type layer is formed between the p-type layer and the side wall of the trench. Such a structure allows reducing the on voltage, thereby reducing the channel resistance.

Patent Document 2 discloses a trench gate type FET having a planar pattern in which the unit cell is a regular hexagon and the unit cells are arranged in a honeycomb pattern. It also discloses a recess structure in which a groove (recess) for exposing the p-type layer is formed by removing a part of the n-type layer formed on the p-type layer, and an electrode is formed in contact with the p-type layer. The recess has a regular hexagonal pattern obtained by reducing the regular hexagon of the unit cell.

When the unit cell of the semiconductor device has a regular hexagonal pattern, generally the recess also has a regular hexagonal pattern (for example, Patent Document 3). In designing a semiconductor device having a recess structure, the recess pattern is often the minimum manufacturable pattern.

The recess is formed by dry etching GaN, and a dry etching mask used in dry etching is formed by photolithography. However, the recess pattern is small, and thus cannot be precisely reproduced due to the limit of the photolithography resolution, resulting in rounded corners.

Therefore, conventionally, the mask pattern for photolithography is corrected in advance by OPC (Optical Proximity Correction).

Patent Document 1: Japanese Patent Application Laid-Open (kokai) No. 2018-125441
Patent Document 1: Japanese Patent Application Laid-Open (kokai) No. 2009-117820
Patent Document 1: Japanese Patent Application Laid-Open (kokai) No. 2015-159138

However, the formation of the structure disclosed in Patent Document 1, requires regrowth of semiconductor layer or ion implantation, and thus the process was complicated. There was also a problem that when plane distribution of the hole concentration was constant in the low-concentration p-type region surrounding the side wall of the trench, current was concentrated at the corners of the trench.

To determine the mask pattern corrected by OPC, process simulation or inspection needs to be repeated. This must be repeated each time when the device design is reviewed. Therefore, it has been desired to provide a method for more easily forming a groove having a small pattern such as recess.

SUMMARY OF THE INVENTION

In view of the foregoing, one object of the present invention is to provide a Group III nitride semiconductor device that suppresses current concentration at the corners of the trench. The other object of the present invention is to provide a method for producing a semiconductor device by which a recess having a small pattern can be formed on a Group III nitride semiconductor layer.

In one aspect of the present invention, there is provided a semiconductor device including:
a Group III nitride semiconductor layer having a first n-type layer, a p-type layer formed on the first n-type layer, and a second n-type layer formed on the p-type layer;
a trench having a depth reaching from the surface of the second n-type layer to the first n-type layer, and dividing the semiconductor layer into unit cells to have a predetermined planar pattern; and
a recess having a depth reaching from the surface of the second n-type layer to the p-type layer,
wherein a planar pattern of the recess is a regular polygon contained in the planar pattern of the semiconductor layer, sides of the regular polygon are not parallel to sides of the planar pattern of the semiconductor layer, a>b when a shortest distance from a corner of the trench to the recess is defined as a and a shortest distance from a side of the trench to the recess is defined as b in a plan view, and the Mg activation ratio is lower in the vicinity of corners of the trench than that in other regions in the vicinity of the side walls of the trench of the p-type layer.

In the present invention, the trench preferably has a planar pattern in which regular hexagons of the planar pattern of the semiconductor layer are arranged in a honeycomb pattern. The recess may has a planar pattern of regular hexagon obtained by reducing the regular hexagon of the planar pattern of the semiconductor layer with the same center, and may be rotated with respect to the regular hexagon of the planar pattern of the semiconductor layer. In this case, the planar pattern of the recess is preferably rotated by 25° to 35° with respect to the regular hexagon of the planar pattern of the semiconductor layer.

In the present invention, a diameter of an inscribed circle of the regular hexagon of the planar pattern of the recess is preferably 0.8 μm to 2.0 μm. Within this range, hydrogen can be efficiently removed from the recess during heat treatment for activating the p-type layer. Moreover, the unit cell size can be reduced, and the side wall area of the trench can be enlarged, thereby improving the electrical characteristics.

In the present invention, the side wall of the trench is preferably an a-plane, and the side wall of the recess is preferably a m-plane. Thereby, the reproducibility of the planar patterns of the trench and the recess is improved.

In the present invention, a–b is preferably 0.8 μm to 1.9 μm. Within this range, current concentration at the corners of the trench can be more suppressed. Also the semiconductor device is preferably a vertical trench gate type field effect transistor.

In the other aspect of the present invention, there is provided a method for producing a semiconductor device, the method comprising:
forming an etching mask on a Group III nitride semiconductor layer having a c-plane main surface;
forming a resist layer having an opening in a circular pattern inscribed inside a regular hexagon on the etching mask, using a photomask with a regular hexagonal pattern with an inscribed circle diameter of 0.8 μm to 2.0 μm;
forming an opening in a circular pattern in the etching mask by dry etching the etching mask exposed in the opening of the resist layer;
forming a groove in a circular pattern by dry etching the semiconductor layer exposed in the opening of the etching mask;

forming a groove in a regular hexagonal pattern by wet etching a side wall of the groove to expose the m-plane on the side wall of the groove.

The depth of the groove is preferably 0.2 μm to 0.5 μm to improve the reproducibility of the groove pattern and more easily form the groove.

The sides of the regular hexagon of the photomask are preferably parallel to the m-axis direction or a-axis direction of the semiconductor layer to improve the reproducibility of the groove pattern and more easily form the groove.

The semiconductor device is preferably a vertical FET having a recess structure, and the groove is preferably a recess in which a body electrode is formed. In the vertical FET having a recess structure, the recess is often the minimum pattern for designing a device. Therefore, the present invention is suitably applied to form a recess.

According to the present invention, current concentration at the corners of the trench can be suppressed. According to the method for producing a semiconductor device of the other invention, a groove having a small pattern can be easily formed on the Group III nitride semiconductor layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, these embodiments should not be construed as limiting the present invention thereto.

First Embodiment

Figure 1:
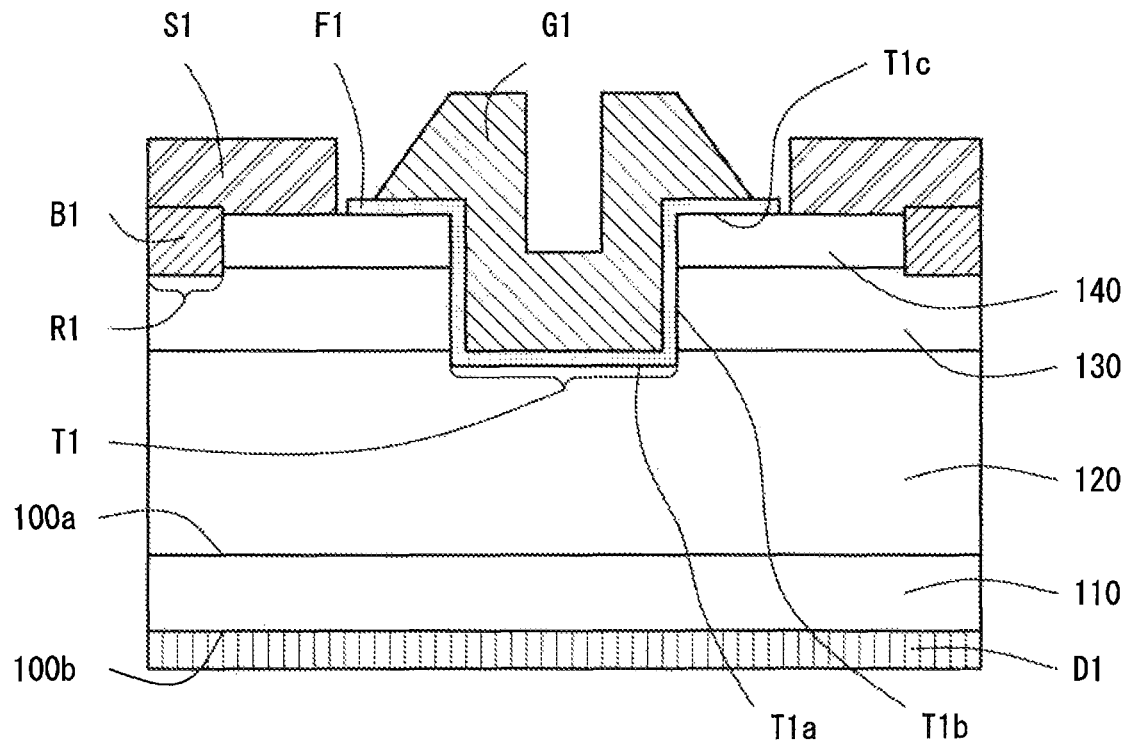
FIG. 1 is a view of the structure of a semiconductor device according to a first embodiment.

FIG. 1 is a view showing the structure of a semiconductor device according to a first embodiment. As shown in FIG. 1, the semiconductor device according to the first embodiment is a trench gate type FET, which includes a substrate 110, a first n-type layer 120, a p-type layer 130, a second n-type layer 140, a trench T1, a recess R1, a gate insulating film F1, a gate electrode G1, a source electrode S1, a body electrode B1, and a drain electrode D1.

The substrate 110 is a flat substrate made of Si-doped n-GaN having a c-plane main surface and having a thickness of 300 μm. The Si concentration is $1 \times 10^{18}/cm^3$. The substrate may be made of any conductive material capable of being used as a growth substrate for a Group III nitride semiconductor. For example, ZnO and Si may be used. However, in terms of lattice matching, a GaN substrate is preferably used as in the present embodiment.

The first n-type layer 120 is a Si-doped n-GaN layer having a c-plane main surface, deposited on the substrate 110 (one surface 100a of the substrate 110). The first n-type layer 120 has a thickness of 10 μm, and a Si concentration of $1 \times 10^{16}/cm^3$.

The p-type layer 130 is a Mg-doped p-GaN layer having a c-plane main surface, deposited on the first n-type layer 120. The p-type layer 130 has a thickness of 1.0 μm, and a Mg concentration of $2 \times 10^{18}/cm^3$. The p-type layer 130 has a Mg activation ratio (reduction rate about concentration of hydrogen combined to Mg) distribution in a plane parallel to the main surface thereof. The Mg activation ratio is lower in a region more distant from the recess R1. The Mg activation ratio is lower in the vicinity of corners T1d of the trench T1 than that in other regions in the vicinity of the side walls T1b of the trench T1 of the p-type layer 130 (in other words, the hydrogen concentration is higher).

The second n-type layer 140 is a Si-doped n-GaN layer having a c-plane main surface, deposited on the p-type layer 130. The second n-type layer 140 has a thickness of 0.2 μm and a Si concentration of $1 \times 10^{18}/cm^3$.

The trench T1 is a groove formed at a predetermined position on the surface of the second n-type layer 140, and has a depth passing through the second n-type layer 140 and the p-type layer 130 and reaching the first n-type layer 120. The first n-type layer 120 is exposed in the bottom surface T1a of the trench T1. The first n-type layer 120, the p-type layer 130, and the second n-type layer 140 are exposed on the side walls T1b of the trench T1. The side surfaces of the p-type layer 130 exposed on the side walls T1b of the trench T1 are regions serving as a channel in the FET of the first embodiment. The side wall T1b of the trench T1 is an a-plane (11-20), and fine irregularities are formed on that a-plane. Irregularities allows to widen the area of the side walls T1b of the trench T1, thereby improving the electrical characteristics of the semiconductor device.

The gate insulating film F1 made of $Al_2O_3$ is continuously formed in a film along the bottom surface T1a, the side walls T1b, and the top surfaces T1c of the trench T1. The top surface of the trench T1 is the surface of the second n-type layer 140, and a region in the vicinity of the side walls T1b of trench T1. The thickness of the gate insulating film F1 is 100 nm. The gate insulating film F1 may be made of $SiO_2$, SiN, SiON, AlN, AlON, ZrON, $HfO_2$, $ZrO_2$, and others other than $Al_2O_3$. The gate insulating film F1 is not necessarily a single layer, but may be a plurality of layers.

The gate electrode G1 is formed on the gate insulating film F1in. That is, the gate electrode G1 is formed in a film continuously on the bottom surface T1a, the side walls T1b, and the top surfaces T1c of the trench T1, via the gate insulating film F1. The gate electrode G1 is made of Al.

The recess R1 is a groove provided in a region where the gate insulating film F1 is not formed on the surface of the second n-type layer 140, and has a depth passing through the second n-type layer 140 and reaching the p-type layer 130. The p-type layer 130 is exposed in the bottom surface of the recess R1. The p-type layer 130 and the second n-type layer 140 are exposed on the side walls of the recess R1. The side wall of the recess R1 is a m-plane (10-10).

Figure 2:
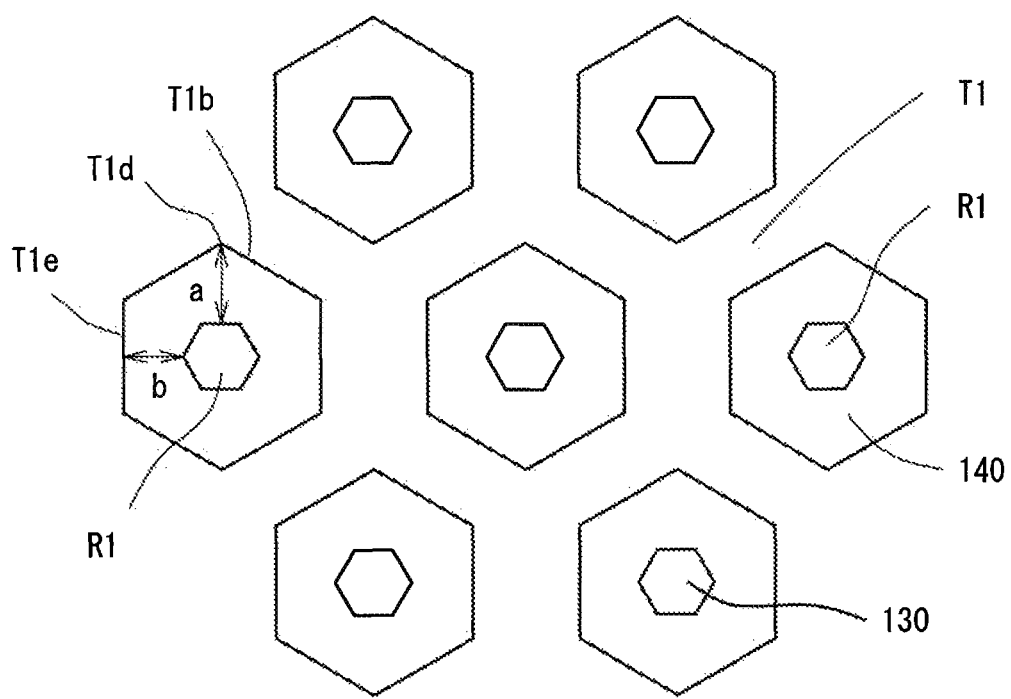
FIG. 2 is a view showing a pattern of trench T1 and recess R1.

FIG. 2 is a view showing a planar pattern of trench T1 and recess R1. As shown in FIG. 2, the semiconductor device according to the first embodiment has a planar pattern in which regular hexagonal unit cells are arranged in a honeycomb pattern. The semiconductor layer (first n-type layer 120, p-type layer 130, and second n-type layer 140) is sectionalized into regular hexagonal patterns by the trench T1. That is, the second n-type layer 140 and the p-type layer 130 are divided into regular hexagonal patterns by the trench T1, and the first n-type layer 120 is a common layer.

The recess R1 has a small regular hexagonal pattern contained in the regular hexagonal pattern of the semiconductor layer (second n-type layer 140) sectionalized by the trench T1, which is obtained by reducing the regular hexagon of the semiconductor layer (second n-type layer 140) with the same center. The regular hexagonal pattern of the recess is rotated by 30° with respect to the regular hexagon of the semiconductor layer (second n-type layer 140).

In the conventional structure in which the pattern of the recess R1 is not rotated, the Mg activation ratio is almost equal at the side walls T1b of the trench T1, and current is concentrated at the corners T1d of the trench T1 when the device is turned on. On the other hand, in the first embodiment in which the pattern of the recess R1 is rotated, the Mg activation ratio is lower at the corners T1d of the trench T1 than that in other regions of the side walls T1b of the trench T1 of the p-type layer 130, thereby suppressing current concentration at the corners T1d of the trench T1. This is because when a shortest distance from the corner T1d of the trench T1 to the recess R1 is defined as a, and a shortest distance from the side T1e of the trench T1 to the recess R1 is defined as b in a plan view, the value of a−b becomes greater by rotating the pattern of the recess R1.

The pattern of the recess R1 is not necessarily rotated by 30°. The recess R1 may have any pattern as long as the pattern is rotated so that the sides of the recess R1 are not parallel to the sides of the trench T1 in a plan view. That is, the rotation angle may be within a range of 0° to 30°. However, to suppress current concentration at the corners T1d of the trench T1, the pattern is rotated by preferably 25° to 35°, and most preferably, 30° so that the value of a−b is maximum.

Moreover, a−b is preferably 0.8 μm to 1.9 μm. Within this range, current concentration at the corners T1d of the trench T1 can be suppressed. a−b is more preferably 1.0 μm to 1.6 μm.

The diameter of the inscribed circle of the regular hexagon of the recess R1 is preferably 0.8 μm to 2.0 μm. Within this range, hydrogen can be efficiently removed from the p-type layer 130 during heat treatment for activating the p-type layer 130. That is, the recess R1 is operated as a window through which hydrogen combined to Mg in the p-type layer 130 and became free by heat treatment is exhausted. Moreover, the unit cell size can be reduced, and the side wall area of the trench can be enlarged, thereby improving the electrical characteristics. The diameter of the inscribed circle of the regular hexagon of the recess R1 is more preferably 0.9 μm to 1.5 μm, and further preferably, 1.0 μm to 1.2 μm.

The recess R1 is not necessarily a regular hexagon, and may be any polygonal pattern, in which the sides of the recess R1 are not be parallel to the sides of the trench T1 in a plan view, and the value of a−b is greater than 0. However, in terms of ease of design or formation, the pattern of the recess R1 is preferably a pattern obtained by reducing and rotating the regular hexagonal pattern of the semiconductor layer (pattern of the second n-type layer 140) in each unit cell.

The body electrode B1 is formed in the bottom surface of the recess R1. The body electrode B1 is made of Pd.

The source electrode S1 is continuously formed on the body electrode B1 and the second n-type layer 140. The source electrode S1 is made of Ti/Al.

The drain electrode D1 is formed on the back surface of the substrate 110 (the surface 100b opposite to the surface on which the first n-type layer 120 is formed). The drain electrode D1 is made of the same material as that of the source electrode S1, and is made of Ti/Al.

In the semiconductor device according to the first embodiment, the p-type layer 130 has a Mg activation ratio distribution in the surface thereof. The Mg activation ratio is lower in a region more distant from the recess R1. The Mg activation ratio is lower in the vicinity of corners T1d of the trench T1 than that in other regions in the vicinity of side walls T1b of the trench T1 of the p-type layer 130. Therefore, when the semiconductor device according to the first embodiment is turned on, current concentration at the corners T1d of the trench T1 is suppressed, and on-resistance is reduced.

Next will be described processes for producing the semiconductor device according to the first embodiment with reference to the drawings.

Firstly, a n-GaN substrate 110 having a c-plane main surface is prepared. Then, a first n-type layer 120, a p-type layer 130, and a second n-type layer 140 are sequentially formed through MOCVD (refer to FIG. 3A). In MOCVD, ammonia gas ($NH_3$) is used as a nitrogen source, and trimethylgallium ($Ga(CH_3)_3$: TMG) as a gallium source. Trimethylindium ($In(CH_3)_3$: TMI) is used as an indium source, and trimethylaluminum ($Al(CH_3)_3$: TMA) is used as an aluminum source. Silane ($SiH_4$) is used as an n-type dopant gas, and biscyclopentadienylmagnesium ($Mg(C_5H_5)_2$: $CP_2Mg$) is used as a p-type dopant gas. Hydrogen or nitrogen is used as a carrier gas.

Figure 3A:
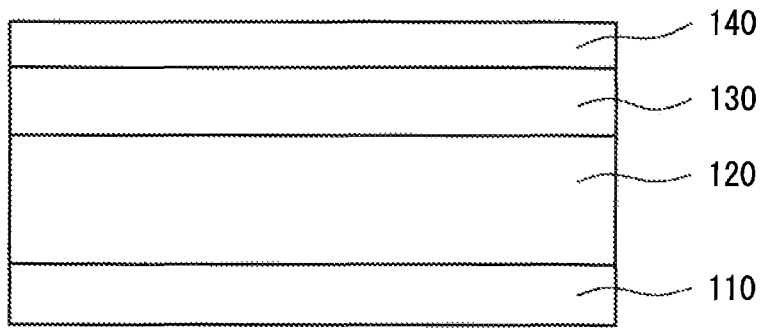
FIGS. 3A to 3D are sketches showing processes for producing the semiconductor device according to the first embodiment.
Figure 3B:
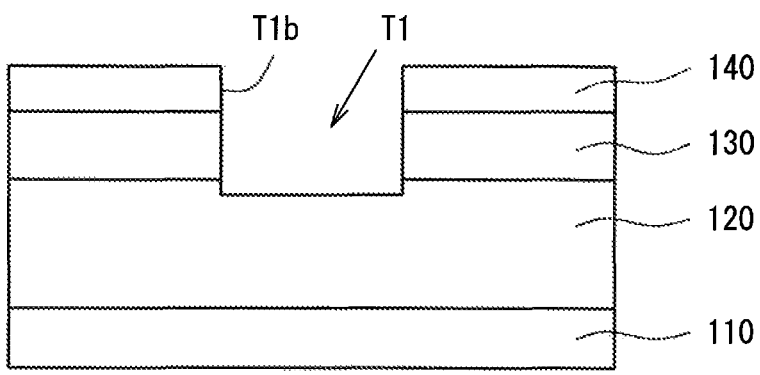

A trench T1 is formed by dry etching the predetermined position on the surface of the second n-type layer 140 (refer to FIG. 3B). The trench T1 has a pattern in which regular hexagons of the pattern of the semiconductor layer (the pattern of the second n-type layer 140) are arranged in a honeycomb pattern, and the side wall T1b of the trench T1 is an a-plane. Dry etching is performed until the first n-type layer 120 is exposed. Chlorine-based gas such as $Cl_2$, $SiCl_4$, and $CCl_4$ is used for dry etching. Any dry etching method such as ICP etching may be used.

Wet etching is performed using TMAH (Tetramethyl Ammonium Hydroxide) solution. Planes other than the c-plane of the Group III nitride semiconductor can be wet etched using TMAH solution, and wet etching proceeds until the m-plane is exposed. Here, the side wall T1b of the trench T1 is an a-plane. Therefore, the side wall T1b of the trench T1 is etched to a saw-tooth pattern comprising m-plane, thereby increasing the area of the side walls T1b of the trench T1, and improving the electrical characteristics of the semiconductor device. NaOH (sodium hydroxide), KOH (potassium hydroxide), and $H_3PO_4$ (phosphoric acid) may be used other than TMAH as a wet etching solution.

Figure 3C:
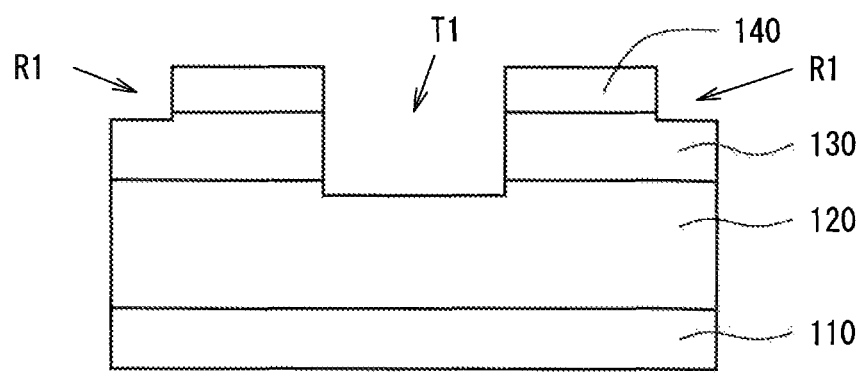

Subsequently, a recess R1 is formed by dry etching at a predetermined position on the surface of the second n-type layer 140 (refer to FIG. 3C). Etching is performed until the p-type layer 130 is exposed. The etching gases are the same as in forming the trench T1.

Here, the planar pattern of the recess R1 is a regular hexagon obtained by reducing the regular hexagon of the second n-type layer 140 with the same center, second n-type layer 140, and is a regular hexagonal pattern rotated by 30° with respect to the regular hexagon of the second n-type layer 140.

In the first embodiment, the recess R1 is formed after the formation of the trench T1. However, the trench T1 may be formed after the formation of the recess R1.

After the formation of the recess R1, the side walls of the recess R1 may be wet etched using TMAH solution. The regular hexagonal pattern of the recess R1 may be formed more accurately. The wet etching solution used is the same as in wet etching the side wall T1b of the trench T1.

Then, the p-type layer 130 is activated by heating in a nitrogen atmosphere. Hydrogen is efficiently removed from the p-type layer 130 exposed in the bottom surface of the recess R1, thereby efficiently activating Mg in the p-type layer 130. Hydrogen is hardly removed from the side wall T1b of the trench T1.

In this heat treatment, hydrogen in the p-type layer 130 is more easily removed from a region closer to the recess R1, and is more hardly removed from a region more distant from the recess R1. On the other hand, as described above, hydrogen is not removed from the side wall T1b of the trench T1. Therefore, distribution occurs in the hydrogen concentration of the p-type layer 130 according to the pattern of the recess R1.

In the conventional pattern in which the regular hexagonal pattern of the recess R1 is not rotated with respect to the regular hexagonal pattern of the second n-type layer 140, the difference a−b between a shortest distance a from the corner T1d of the trench T1 to the recess R1 and a shortest distance b from the side T1e of the trench T1 to the recess R1, is small. Therefore, there is little difference in the amount of hydrogen removed between in the vicinity of the corner T1d of the trench and in the vicinity of the center of each side the trench T1 of the p-type layer 130, and there is little difference in the Mg activation ratio. As a result, in the conventional pattern of the recess R1, the Mg activation ratio is nearly constant in a region in the vicinity of the side wall T1b of the trench T1 of the p-type layer 130.

On the other hand, in the first embodiment where the regular hexagonal pattern of the recess R1 is rotated by 30° with respect to the regular hexagonal pattern of the second n-type layer 140, the difference a−b between a shortest distance a from the corner T1d of the trench T1 to the recess R1 and a shortest distance b from the side T1e of the trench T1 to the recess R1, is greater than that in the conventional pattern. Therefore, there is difference in the amount of hydrogen removed between in the vicinity of the corner T1d of the trench and in the vicinity of the center of each side the trench T1 of the p-type layer 130, and there is a difference in the Mg activation ratio. As a result, in the pattern of the recess R1 in the first embodiment, the Mg activation ratio is lower in the vicinity of the corner T1d of the trench T1 than in other regions in the vicinity of the side walls T1b of the trench T1 of the p-type layer 130.

Figure 3D:
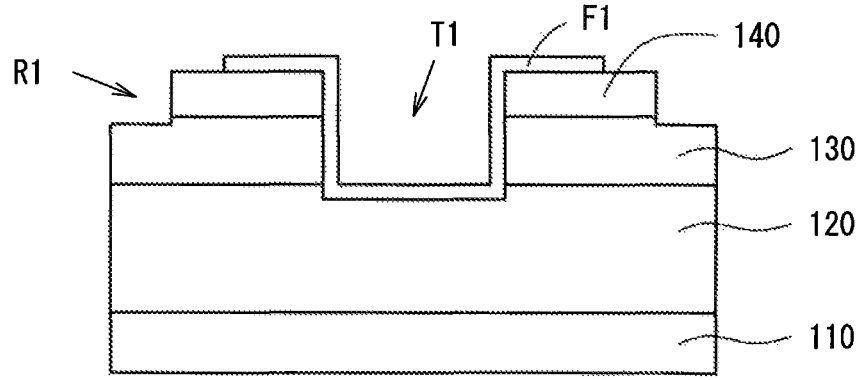

A gate insulating film F1 is formed through ALD (Atomic Layer Deposition) on the bottom surface T1a and the side walls T1b of the trench T1, and in the vicinity of the trench T1 on the surface of the second n-type layer 140 (refer to FIG. 3D).

A gate electrode G1, a body electrode B1, and a source electrode S1 are sequentially formed through lift-off. In addition, a drain electrode D1 is formed on the back surface of the substrate 110 through lift-off. The order of electrode formation is not limited to this, and the electrodes may be formed in any order. Thus, the semiconductor device according to the first embodiment shown in FIG. 1 is produced.

First Variation

In the first embodiment, each of the unit cells sectionalized by the trench T1 has a regular hexagonal pattern, the semiconductor layer is sectionalized into a regular hexagonal pattern, and the unit cells are arranged in a honeycomb pattern. However, the pattern is not limited to this. For example, squares may be arranged in a triangular lattice or in a square lattice. The recess R1 may have any planar pattern as long as it is a regular polygon contained in the planar pattern of the semiconductor layer (second n-type layer 140), the sides of the regular polygon are not parallel to the sides of the planar pattern of the semiconductor layer, and a>b when a shortest distance from a corner of the trench to the recess is defined as a and a shortest distance from a side of the trench to the recess is defined as b in a plan view.

Figure 4:
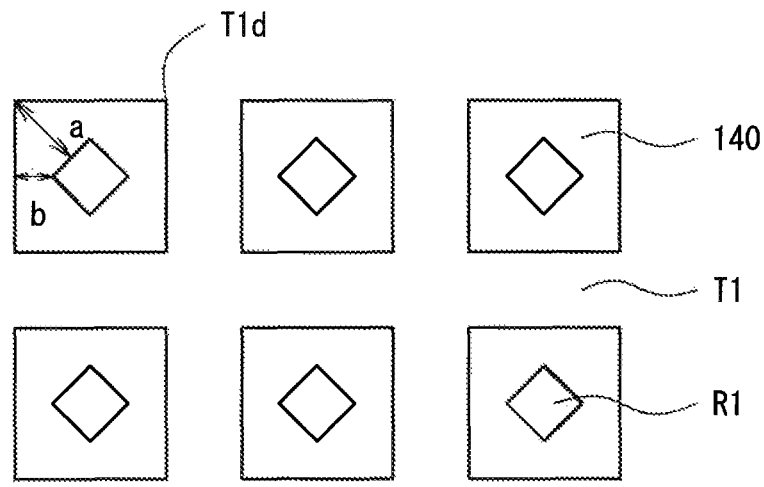
FIG. 4 is a view showing a pattern of trench T1 and recess R1.

When the semiconductor layer is d sectionalized by the trench T1 into regular polygons, the recess R1 preferably has a pattern obtained by reducing and rotating the regular polygon with the same center. FIG. 4 shows an example. FIG. 4 shows the pattern in which the semiconductor layer (second n-type layer 140) is sectionalized into unit cells so as to have a square pattern, unit cells are arranged in a square lattice, and the recess R1 has a pattern obtained by reducing the square of each unit cell with the same center. In this case, the square of the recess R1 is preferably rotated by 45° with respect to the square of the semiconductor layer (second n-type layer 140) so that a−b is the maximum value (refer to FIG. 4).

Figure 5:
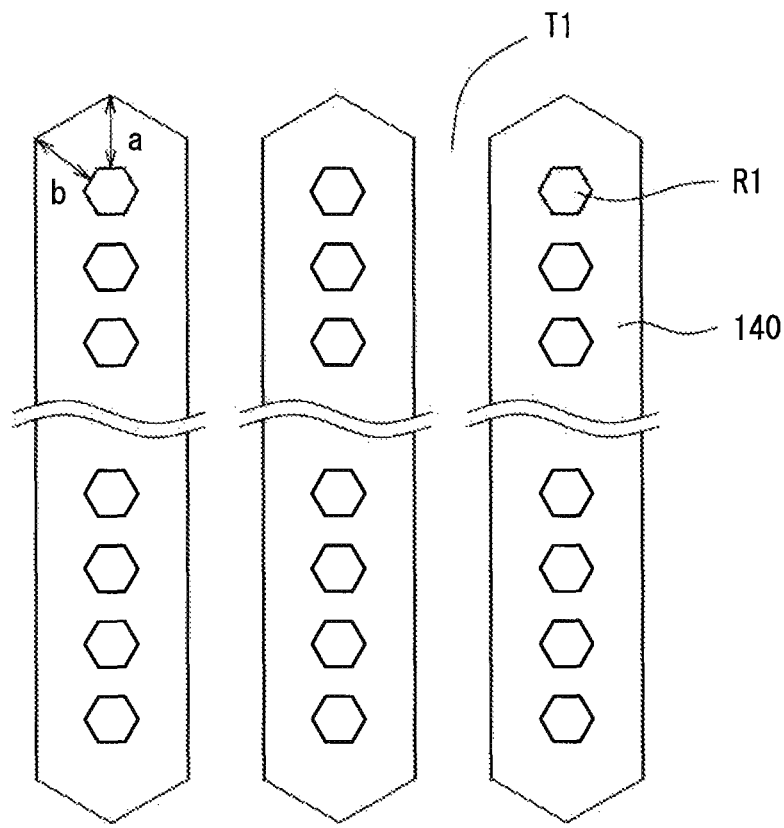
FIG. 5 is a view showing a pattern of trench T1 and recess R1.

Each of the unit cells sectionalized by the trench T1 may have a long rectangular pattern or hexagon, and unit cells may be arranged in a stripe. In this case, a plurality of recesses R1 having a regular polygonal pattern may be arranged at predetermined intervals in a longitudinal direction. FIG. 5 shows an example. FIG. 5 shows the pattern in which the semiconductor layer has a long hexagonal pattern, and a plurality of recesses R1 having a regular hexagonal pattern are arranged in a longitudinal direction in the long hexagon of the semiconductor layer. The long hexagon is obtained by extending two parallel sides of the hexagon. Each side of the regular hexagon of the recess R1 has an angle of 30° with respect to each side of the long hexagon of the semiconductor layer.

Second Embodiment

A second embodiment relates to a method for producing a recess R1 of the trench gate type vertical field effect transistor (FET) according to the first embodiment. The semiconductor device (FET) has the same structure as that shown in FIG. 1 of the first embodiment. The first n-type layer 120, the p-type layer 130, and the second n-type layer 140 in FIG. 1 correspond to the semiconductor layer in the invention of the production method.

In the production method in the second embodiment, a diameter of an inscribed circle of the regular hexagon of the recess R1 is preferably 0.8 μm to 2.0 μm. Such a small sized recess R1 has been difficult to form, but can be more easily formed by the production method according to the second embodiment. The diameter of the inscribed circle of the regular hexagon of the recess R1 is more preferably 0.9 µm to 1.5 µm, and further preferably 1.0 µm to 1.2 µm.

The recess R1 may have any depth as long as the depth reaches the p-type layer 130. However, the depth of the recess R1 is preferably 0.2 µm to 0.5 µm. Within this range, the reproducibility of the regular hexagon pattern of the recess R1 is enhanced. The depth of the recess R1 is more preferably 0.2 µm to 0.4 µm, and further preferably, 0.25 µm to 0.3 µm.

As described in the first embodiment, the trench formation step from FIG. 3A to 3B is performed. The production method of the second embodiment has features in the method forming a trench R1 shown in FIG. 3C. An etching mask M1 is formed at a predetermined position on the surface of the second n-type layer 140, and a recess R1 is formed by dry etching the surface of the second n-type layer 140 exposed in an opening of the etching mask M1 (refer to FIG. 3C). Etching is performed until the p-type layer 130 is exposed.

The method for forming a recess R1 will next be described in detail with reference to FIGS. 6A to 6D. Firstly, an etching mask M1 made of SiO$_2$ is formed on a second n-type layer 140 (refer to FIG. 6A). The etching mask M1 may be made of SiN other than SiO$_2$.

Figure 6A:
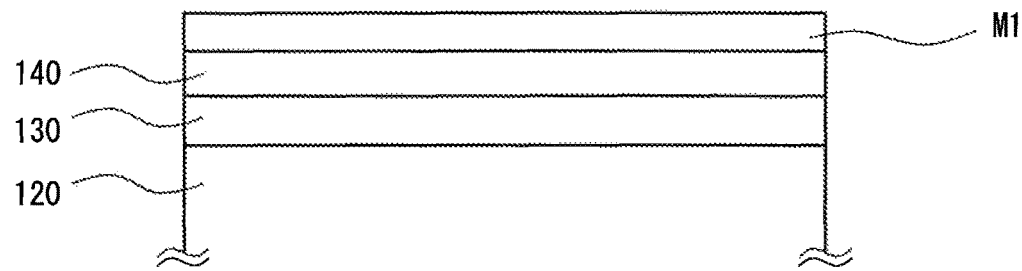
FIGS. 6A to 6D are sketches showing processes for forming a recess R1 in a production method according to a second embodiment.
Figure 6B:
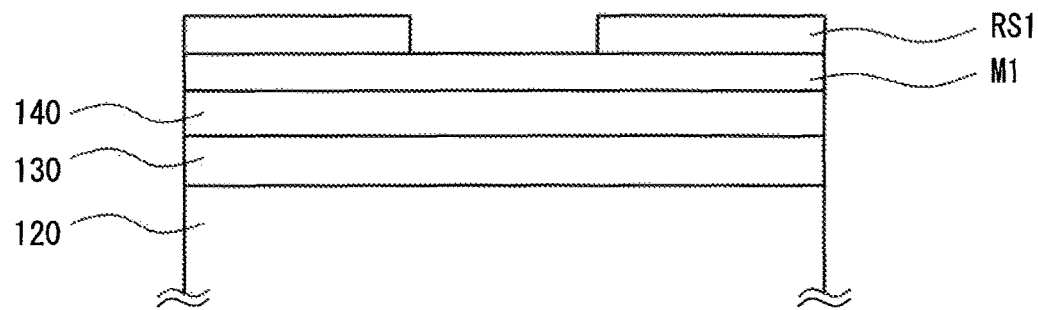
Figure 7:
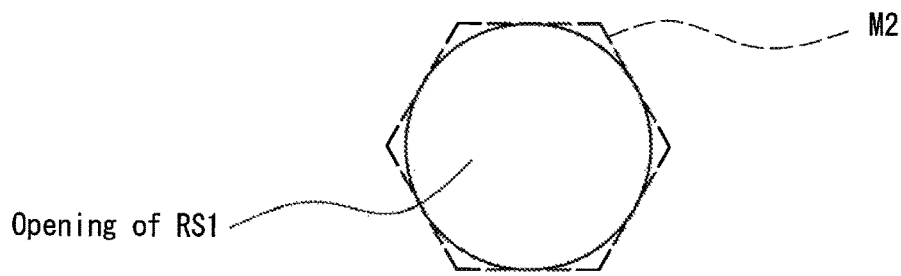
FIG. 7 is a view showing a relation between a pattern of photomask M2 and opening of resist layer RS1 in the second embodiment.

Subsequently, a resist layer RS1 is formed so as to have an opening in a circular pattern at a predetermined position on the etching mask M1 through photolithography (refer to FIG. 6B). As shown in FIG. 7, a photomask M2 used in photolithography of the resist layer RS1 has a regular hexagonal pattern, and a diameter of the inscribed circle of the regular hexagon is 0.8 µm to 2.0 µm. The photomask M2 has a regular hexagonal opening pattern when the resist is positive. When the resist is negative, however, the photomask M2 has a shield pattern of the regular hexagon corresponding to the recess R1 and an opened pattern in the other area. When the diameter of the inscribed circle of the regular hexagon is 2 µm, it is a resolution limit of an exposing device used in photolithography, and pattern fidelity is poor. Therefore, when the photomask M2 in a regular hexagonal pattern with an inscribed circle diameter of 0.8 µm to 2 µm is used, the regular hexagon functions as OPC, the opening of the resist layer RS1 has a inscribed circle pattern of the regular hexagon (refer to FIG. 7). As a result, the resist layer RS1 having an opening in an inscribed circle pattern can be formed with good reproducibility.

Figure 6C:
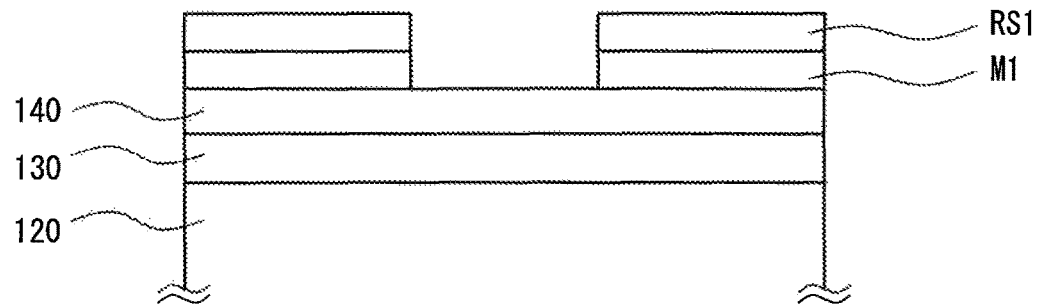

As shown in FIG. 6C, the etching mask M1 exposed in the opening of the resist layer RS1 is dry etched with the resist layer RS1 as a mask. Fluorine-based gas is used as an etching gas. Dry etching is performed until the second n-type layer 140 is exposed. The dry etching method is, for example, ICP etching. Thus, the etching mask M1 is formed having a pattern obtained by transferring the pattern of the resist layer RS1 as it is. That is, the etching mask M1 is formed having the same circular opening at the same position as the opening of the resist layer RS1 (refer to FIG. 6C).

Figure 6D:
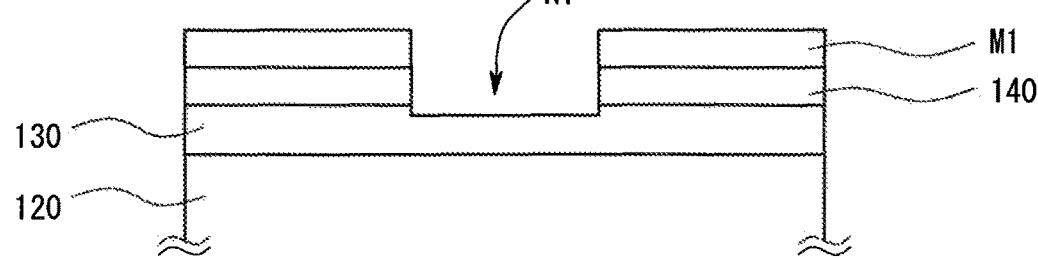

As shown in FIG. 6D, the resist layer RS1 is removed, and the second n-type layer 140 exposed in the opening of the etching mask M1 is dry etched with the etching mask M1 as a mask. Fluorine-based gas is used as an etching gas. Dry etching is performed until the p-type layer 130 is exposed. Thus, the recess R1 is formed having a pattern obtained by transferring the pattern of the etching mask M1 as it is. That is, the recess R1 being the same circular groove is formed at the same position as the opening of the etching mask M1 (refer to FIG. 6D).

Figure 9A:
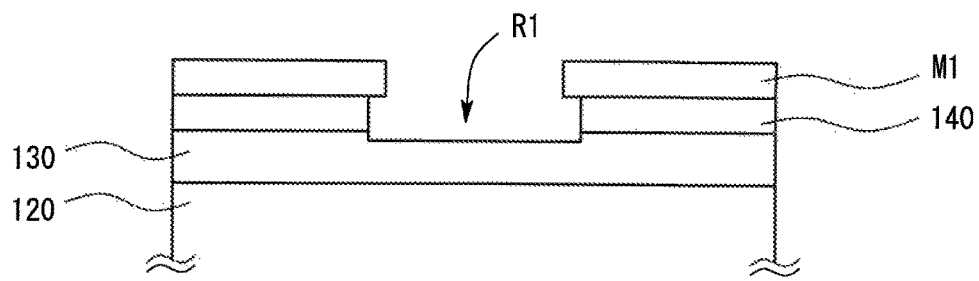
FIGS. 9A to 9B are cross sectional views of FIG. 8.
Figure 9B:
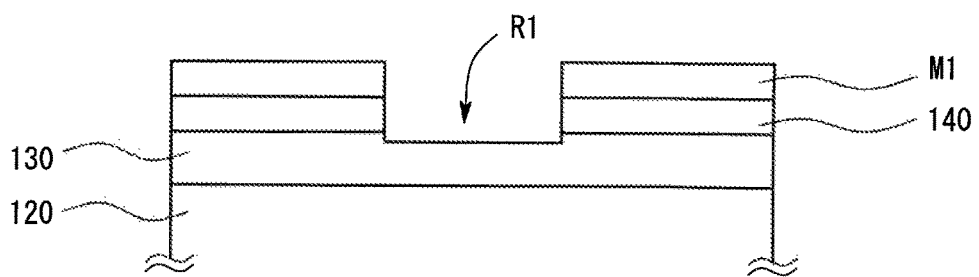

As shown in FIGS. 9A and 9B, the side wall of the recess R1 is dry etched using TMAH solution with the etching mask M1 left. As described above, wet etching using TMAH solution proceeds until the m-plane is exposed. Therefore, a region where the m-plane is exposed of the circular recess R1 is not wet etched, and wet etching proceeds in other region of the circular recess R1 until the m-plane is exposed. NaOH (sodium hydroxide), KOH (potassium hydroxide), and H$_3$PO$_4$ (phosphoric acid) may be used other than TMAH as a wet etching solution.

Figure 8:
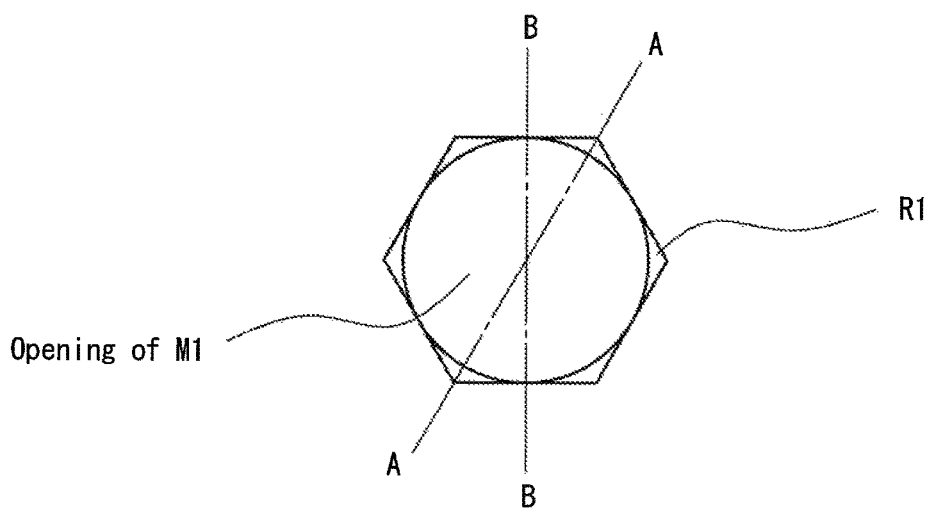
FIG. 8 is a view showing a relation between a pattern of opening pattern of etching mask M1 and a pattern of recess R1 in the second embodiment.

As a result, the recess R1 is wet etched in a regular hexagonal pattern. The side walls of the recess R1 are all the m-plane of GaN. As shown in FIG. 8, the regular hexagon of the recess R1 is the regular hexagon circumscribing the circular opening of the etching mask M1. Therefore, the regular hexagon of the recess R1 is almost the same as the regular hexagon of the photomask M2 used in photolithography, or the regular hexagon obtained by rotating the regular hexagon of the photomask M2 around the center axis. After that, the etching mask M1 is removed.

FIG. 8 shows the opening pattern of the etching mask M1 and the pattern of the recess R1 after wet etching. FIG. 9A shows a cross section along the line A-A in FIG. 8, and FIG. 9B shows a cross section along the line B-B in FIG. 8. As shown in FIG. 9A, since the a-plane is exposed as the side wall of the recess R1 in the A-A cross sectional direction, wet etching proceeds until the m-plane is exposed, and a step is formed between the side surface of the opening of the etching mask M1 and the side surface of the second n-type layer 140. That is, in FIG. 9A, the intersection of the two adjacent m-planes appears on the side wall of the recess R1. On the other hand, as shown in FIG. 9B, since the m-plane is exposed as the side wall of the recess R1 in the B-B cross sectional direction, wet etching is not performed, and a step is not formed between the side surface of the opening of the etching mask M1 and the side surface of the second n-type layer 140.

Thus, the recess R1 in a regular hexagonal pattern having an inscribed circle diameter of 0.8 µm to 2 µm can be easily formed without using a complicated mask pattern.

The following is preferably performed to improve the reproducibility of the regular hexagonal pattern of the recess R1 and easily form the regular hexagonal pattern of the recess R1. The diameter of the inscribed circle of the regular hexagon of the photomask M2 (FIG. 7) for forming the resist layer RS1 is preferably 0.9 µm to 1.5 µm, and more preferably 1.0 µm to 1.2 µm. The depth of the recess R1 of the semiconductor layer is preferably 0.2 µm to 0.5 µm, more preferably 0.2 µm to 0.4 µm, and further preferably 0.25 µm to 0.3 µm. The sides of the regular hexagon of the photomask M2 are preferably parallel to the m-axis or a-axis direction of the second n-type layer 140.

In the first and second embodiments, the recesses R1 are formed after the formation of the trench T1. However, trench T1 may be formed after the formation of the recesses R1.

The p-type layer 130 is activated by heating in an nitrogen atmosphere. Hydrogen is efficiently removed from the p-type layer 130 exposed by the recess R1, and the p-type layer 130 can be efficiently activated.

A gate insulating film F1 is formed through ALD on the bottom surface T1a and the side walls T1b of the trench T1, and in the vicinity of the trench T1 on the surface of the second n-type layer 140 (refer to FIG. 3D).

A gate electrode G1, a body electrode B1, and a source electrode S1 are sequentially formed through lift-off. In addition, a drain electrode D1 is formed on the back surface of the substrate 110. The order of forming electrodes is not limited to this, and the electrodes may be formed in any order. Thus, the semiconductor device according to the first embodiment shown in FIG. 1 is produced.

From the above, the recess R1 having an inscribed circle diameter of 0.8 µm to 2.0 µm can be easily formed without designing a complicated mask such as OPC by the method for producing a semiconductor device according to the first embodiment. Moreover, the recess R1 can be made small. As a result, the unit cell of the semiconductor device according to the first embodiment can also be made small, and the total area of the side walls of the trench T1 serving as a channel can be made large, thereby improving the electrical characteristics of the semiconductor device produced by the production method according to the second embodiment. For example, the diameter of the inscribed circle of the regular hexagonal unit cell may be 1.0 µm to 1.2 µm.

Second Variation

Figure 10:
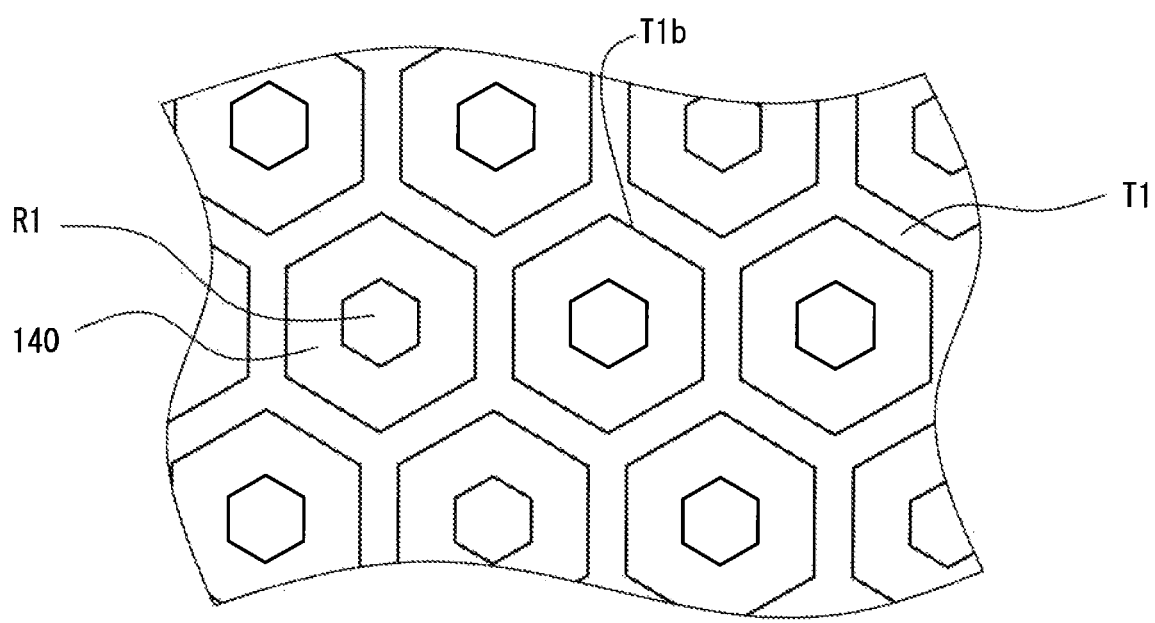
FIG. 10 is a view showing a planar pattern of recess R1 and trench T1 according to a variation of the second embodiment.

In the second embodiment, the side walls of the regular hexagonal recess R1 are m-planes, and the side walls of the regular hexagons left in an island shape by the trench T1 are a-planes. However, as shown in FIG. 10, the side walls of the regular hexagonal recess R1 may be m-planes, and the side walls of the regular hexagons left in an island shape by the trench T1 may also be m-planes. That is, the side wall T1b may be a m-plane in FIG. 1, and a channel may be formed on the m-plane. In this case, after the trench T1 is formed by dry etching shown in FIG. 3B, etching stops when the m-plane is exposed in wet etching shown in FIG. 3C. Therefore, the six side walls T1b of the trench T1 (FIG. 1) are m-planes. In this case, the side walls of the recess R1 and the contour side walls of the trench T1 are parallel and m-planes.

Third Variation

In the second embodiment, the present invention is employed in forming a recess R1 of a vertical FET. However, the present invention is not limited to the formation of recess R1, and may also be applied to the formation of any groove. The recess R1 usually has a minimum pattern in designing the vertical FET. Therefore, the present invention is suitable for forming the recess R1 of the vertical FET.

The second embodiment is a trench gate type FET. However, it may also be applied to any semiconductor device, for example, diode, IGBT, and HFET.

The present invention can be applied to a semiconductor device such as FET.

What is claimed is:

1. A semiconductor device comprising:
    a Group III nitride semiconductor layer including a first n-type layer, a p-type layer formed on the first n-type layer, and a second n-type layer formed on the p-type layer;
    a trench having a depth reaching from surface of the second n-type layer to the first n-type layer, and sectionalizing the Group III nitride semiconductor layer into a plurality of unit cells to have a predetermined planar pattern; and
    a recess having a depth reaching from the surface of the second n-type layer to the p-type layer,
    wherein a planar pattern of the recess is a regular polygon contained in an unit cell the planar pattern of the Group III nitride semiconductor layer, a side of the regular polygon is not parallel to a side of the planar pattern of the Group III nitride semiconductor layer, a>b when a shortest distance from a corner of the trench to the recess is defined as a and a shortest distance from a side of the trench to the recess is defined as b in a plan view, and
    an Mg activation ratio in the p-type layer is lower in a vicinity of the corner of the trench than an Mg activation ratio in other regions, in a vicinity of a side wall of the trench.

2. The semiconductor device according to claim 1, wherein the trench comprises a planar pattern in which a plurality of regular hexagons of the planar pattern of the Group III nitride semiconductor layer are arranged in a honeycomb pattern, and
    the recess has a planar pattern of regular hexagon obtained by reducing the regular hexagon of the planar pattern of the Group III nitride semiconductor layer with a same center, and rotated with respect to the regular hexagon of the planar pattern of the Group III nitride semiconductor layer.

3. The semiconductor device according to claim 2, wherein the planar pattern of the recess is rotated by 25° to 35° with respect to the regular hexagon of the planar pattern of the Group III nitride semiconductor layer.

4. The semiconductor device according to claim 3, wherein the side wall of the trench is an a-plane, and the side wall of the recess is a m-plane.

5. The semiconductor device according to claim 3, wherein a-b is 0.8 µm to 1.9 µm.

6. The semiconductor device according to claim 2, wherein a diameter of an inscribed circle of the regular hexagon of the planar pattern of the recess is 0.8 µm to 2.0 µm.

7. The semiconductor device according to claim 2, wherein the side wall of the trench is an a-plane, and the side wall of the recess is a m-plane.

8. The semiconductor device according to claim 2, wherein a b is 0.8 µm to 1.9 µm.

9. The semiconductor device according to claim 1, wherein the side wall of the trench is an a-plane, and the side wall of the recess is a m-plane.

10. The semiconductor device according to claim 1, wherein a b is 0.8 µm to 1.9 µm.

11. The semiconductor device according to claim 1, wherein the semiconductor device is a vertical trench gate type field effect transistor.

* * * * *